(12) United States Patent
Sunström et al.

(10) Patent No.: US 8,867,671 B2
(45) Date of Patent: Oct. 21, 2014

(54) CONVERSION CIRCUIT FOR CONVERTING COMPLEX ANALOG SIGNAL INTO DIGITAL REPRESENTATION

(75) Inventors: Lars Sunström, Södra Sandby (SE); Roland Strandberg, Furulund (SE)

(73) Assignee: Telefonaktiebolaget L M Ericsson (publ), Stockholm (SE)

( * ) Notice: Subject to any disclaimer, the term of this patent is extended or adjusted under 35 U.S.C. 154(b) by 66 days.

(21) Appl. No.: 13/702,768

(22) PCT Filed: Jun. 13, 2011

(86) PCT No.: PCT/EP2011/059751
§ 371 (c)(1),
(2), (4) Date: Feb. 13, 2013

(87) PCT Pub. No.: WO2011/157665
PCT Pub. Date: Dec. 22, 2011

(65) Prior Publication Data
US 2013/0155748 A1    Jun. 20, 2013

Related U.S. Application Data

(60) Provisional application No. 61/358,089, filed on Jun. 24, 2010.

(30) Foreign Application Priority Data

Jun. 15, 2010    (EP) .................................... 10166047

(51) Int. Cl.
*H03D 3/24*    (2006.01)
*H03D 7/14*    (2006.01)
(Continued)

(52) U.S. Cl.
CPC ................. *H02M 5/02* (2013.01); *H03D 3/007* (2013.01); *H03D 7/1466* (2013.01); *H03D* (Continued)

(58) Field of Classification Search
CPC . H03D 7/1441; H03D 7/1458; H03D 7/1466; H03D 7/1483; H03D 7/1491; H03D 2200/0086; H03D 2200/0072; H03D 2200/0019; H03D 2200/0023; H03D 3/007; H03J 1/0008

USPC ................. 455/323, 130, 302, 296, 313–315, 455/168.1, 199.1, 189.1, 150.1, 188.1; 331/45; 375/340, 342, 316
See application file for complete search history.

(56) References Cited

U.S. PATENT DOCUMENTS

2004/0152418 A1    8/2004    Sinha et al.
2007/0047669 A1*   3/2007    Mak et al. ..................... 375/316
(Continued)

FOREIGN PATENT DOCUMENTS

CN    101483408 A    7/2009
EP    0305603 A1    3/1989
(Continued)

OTHER PUBLICATIONS

Moseley et al., "A Two-Stage Approach to Harmonic Rejection Mixing Using Blind Interference Cancellation", IEEE Transactions on Circuits and Systems, Oct. 2008, pp. 966-970, vol. 55, No. 10.

*Primary Examiner* — Chieh M Fan
*Assistant Examiner* — Michelle M Koeth
(74) *Attorney, Agent, or Firm* — Coats & Bennett, P.L.L.C.

(57)    ABSTRACT

A conversion circuit (20) for converting a complex analog input signal having an in-phase, I, component and a quadrature-phase, Q, component resulting from frequency down conversion of a radio-frequency, RF, signal ($X_{RF}$) to a frequency band covering 0 Hz into a digital representation is disclosed. It comprises a channel-selection filter unit (40) arranged to filter the complex analog input signal, thereby generating a channel-filtered I and Q components, and one or more processing units (53, 53a-b). Each processing unit comprises four mixers (60-75) for generating a first and a second frequency-translated I component and a first and a second channel-filtered Q component based on two LO signals with equal LO frequency and a 90° mutual phase shift. Furthermore, each processing unit comprises a combiner unit (85, 120) for generating a first, a second, a third, and a fourth combined signal proportional to sums and differences between said frequency translated I and Q components. The first and the fourth combined signals form a first complex signal, and the second and the third combined signals form a second complex signal. Each processing unit further comprises four ADCs (110a-d, 115a-d) for providing digital representations of the first complex signal and the second complex signal for forming said digital representation of the analog complex input signal. A related radio receiver circuit and a related electronic apparatus are also disclosed.

19 Claims, 7 Drawing Sheets

(51) Int. Cl.
*H04B 1/00* (2006.01)
*H04B 1/30* (2006.01)
*H02M 5/02* (2006.01)
*H03D 3/00* (2006.01)

(52) U.S. Cl.
CPC ............... 2200/0086 (2013.01); *H04B 1/0032* (2013.01); *H04B 1/30* (2013.01); *H03D 7/1491* (2013.01); *H03D 7/1483* (2013.01)
USPC ............. 375/340; 375/342; 375/316; 331/45; 455/323; 455/313; 455/130; 455/302; 455/296; 455/314; 455/315; 455/168.1; 455/188.1; 455/189.1; 455/150.1

(56) References Cited

U.S. PATENT DOCUMENTS

| | | | |
|---|---|---|---|
| 2009/0143031 A1* | 6/2009 | Shah | 455/114.1 |
| 2009/0160704 A1* | 6/2009 | Zhao et al. | 342/357.12 |
| 2009/0197552 A1 | 8/2009 | Kurahashi et al. | |
| 2009/0291660 A1* | 11/2009 | Trachewsky | 455/296 |
| 2010/0048136 A1* | 2/2010 | Ibrahim et al. | 455/41.3 |
| 2011/0102051 A1* | 5/2011 | Zeller | 327/361 |
| 2011/0298521 A1* | 12/2011 | Ru et al. | 327/356 |

FOREIGN PATENT DOCUMENTS

| | | | | |
|---|---|---|---|---|
| EP | 1786097 A1 | 5/2007 | | |
| WO | 0139364 A1 | 5/2001 | | |
| WO | WO 01/39364 A1 * | 5/2001 | | H03D 7/16 |

\* cited by examiner

CONVERSION CIRCUIT FOR CONVERTING COMPLEX ANALOG SIGNAL INTO DIGITAL REPRESENTATION

TECHNICAL FIELD

The present invention relates to a conversion circuit suitable for converting a complex analog input signal having an in-phase (I) component and a quadrature-phase (Q) component into a digital representation.

BACKGROUND

The use of radio communication, e.g. in cellular communication networks, is continuously increasing. Furthermore, higher and higher bandwidths tend to be used. Increased bandwidth normally imposes harder requirements on components in radio transmitters and receivers. For example, relatively hard bandwidth requirements may be set on analog-to-digital converters (ADCs) used in radio receivers to convert received analog signals to the digital domain for further digital signal processing. A problem associated therewith is that the power consumption of such components (e.g. ADCs) to meet the increasing bandwidth requirements may be relatively high. Hence, there is a need to facilitate a reduction of power consumption in radio receiver circuits.

SUMMARY

Accordingly, an object of the present invention is to facilitate a relatively low power consumption in a radio receiver circuit.

According to a first aspect, there is provided a conversion circuit for converting a complex analog input signal having an in-phase (I) component and a quadrature-phase (Q) component resulting from frequency down conversion of a radio-frequency (RF) signal to a frequency band covering 0 Hz into a digital representation. The conversion circuit comprises a channel-selection filter unit arranged to filter the complex analog input signal, thereby generating a channel-filtered I component and a channel-filtered Q component, wherein the channel-selection filter unit has a passband that covers 0 Hz. The conversion circuit further comprises one or more processing units. Each processing unit comprises a first, a second, a third, and a fourth mixer. The first mixer is arranged to mix the channel-filtered I component with a first local-oscillator (LO) signal, for generating a first frequency-translated I component. The second mixer is arranged to mix the channel-filtered I component with a second LO signal, for generating a second frequency-translated I component. The third mixer is arranged to mix the channel-filtered Q component with the first LO signal, for generating a first frequency-translated Q component. The fourth mixer is arranged to mix the channel-filtered Q component with the second LO signal, for generating a second frequency-translated Q component. Each processing unit further comprises a combiner unit for generating a first combined signal proportional to a sum of the first frequency translated I component and the second frequency-translated Q component, a second combined signal proportional to a difference between the first frequency translated I component and the second frequency-translated Q component, a third combined signal proportional to a sum of the second frequency-translated I component and the first frequency-translated Q-component, and a fourth combined signal proportional to a difference between the first frequency-translated Q component and the second frequency-translated I component. The first and the fourth combined signals form a first complex signal, and the second and the third combined signals form a second complex signal. Each processing unit further comprises a first analog-to-digital converter (ADC), a second ADC, a third ADC, and a fourth ADC for providing digital representations of the first complex signal and the second complex signal for forming said digital representation of the analog complex input signal. The first and the second LO signal of a processing unit have a common LO frequency associated with the processing unit and a mutual 90° phase shift.

The first mixer, the second mixer, the third mixer, and the fourth mixer may be harmonic rejection mixers.

The combiner unit may be an analog combiner unit adapted to generate the first combined signal, the second combined signal, the third combined signal, and the fourth combined signal in the analog domain. In that case, the first ADC may be arranged to convert the first combined signal to the digital domain, the second ADC may be arranged to convert the second combined signal to the digital domain, the third ADC may be arranged to convert the third combined signal to the digital domain, and the fourth ADC may be arranged to convert the fourth combined signal to the digital domain.

Alternatively, the combiner unit may be a digital combiner unit adapted to generate the first combined signal, the second combined signal, the third combined signal, and the fourth combined signal in the digital domain based on digital versions of the first frequency-translated I component, the second frequency-translated I component, the first frequency-translated Q component, and the second frequency-translated Q component. In that case, the first ADC may be operatively connected to the first mixer and arranged to convert the first frequency-translated I component to said digital version of the first frequency-translated I component, the second ADC may be operatively connected to the second mixer and arranged to convert the second frequency-translated I component to said digital version of the second frequency-translated I component, the third ADC may be operatively connected to the third mixer and arranged to convert the first frequency-translated Q component to said digital version of the first frequency-translated Q component, and the fourth ADC may be operatively connected to the fourth mixer and arranged to convert the second frequency-translated Q component to said digital version of the second frequency-translated Q component.

Each of the first mixer, the second mixer, the third mixer, and the fourth mixer may be implemented with a switchable resistor network operatively connected to an input circuit of at least one of the first ADC, the second ADC, the third ADC, and the fourth ADC. A resistance of the switchable resistor network may be switchably variable in response to either the first LO signal for the first and the third mixer or the second LO signal for the second and the fourth mixer. The switchable resistor network may be arranged to provide a constant input resistance to the combination of the switchable resistor network and said input circuit. Said switchable resistor network may, together with said input circuit, form an active RC integrator.

The conversion circuit may comprise a plurality of processing units. The plurality of processing units may have mutually different associated LO frequencies.

The channel-selection filter unit may comprise a first low-pass filter arranged to filter the I component of the complex analog input signal, thereby generating the channel-filtered I component, and a second low-pass filter arranged to filter the Q component of the complex analog input signal, thereby generating the channel-filtered Q component.

Each of the first ADC, the second ADC, the third ADC, and the fourth ADC may have a bandwidth that is lower than that of the channel-selection filter unit.

According to a second aspect, there is provided a radio-receiver circuit comprising a conversion circuit according to the first aspect and a quadrature mixer for generating the complex analog input signal of the conversion circuit by frequency down-conversion of the RF signal.

The RF signal may comprise a number of contiguous frequency bands, each carrying an associated information signal. The conversion circuit may be configured such that each of said information signals is represented, in its entirety, in the digital representation of one of the first complex signal and the second complex signal of one of the processing units of the conversion circuit. Alternatively, the conversion circuit may be configured such that at least one of said information signals is represented partly in a primary signal of the digital representations of the first complex signal and the second complex signal of one of the processing units of the conversion circuit, and partly in a secondary signal of the digital representations of the first complex signal and the second complex signal of one of the processing units of the conversion circuit. In the latter case, the radio-receiver circuit may comprise recombining circuitry adapted to recombine said at least one of the information signals from said primary signal and said secondary signal. The radio-receiver circuit may e.g. be an orthogonal frequency-division multiplexing (OFDM) receiver circuit. In that case, said recombining circuitry may be adapted to recombine said at least one of the information signals in the frequency domain.

According to a third aspect, there is provided an electronic apparatus comprising the radio receiver circuit according to the second aspect. The electronic apparatus may e.g. be, but is not limited to, a mobile terminal or a radio base station.

Further embodiments of the invention are defined in the dependent claims.

It should be emphasized that the term "comprises/comprising" when used in this specification is taken to specify the presence of stated features, integers, steps, or components, but does not preclude the presence or addition of one or more other features, integers, steps, components, or groups thereof.

BRIEF DESCRIPTION OF THE DRAWINGS

Further objects, features and advantages of embodiments of the invention will appear from the following detailed description, reference being made to the accompanying drawings, in which.

DETAILED DESCRIPTION

Figure 1:
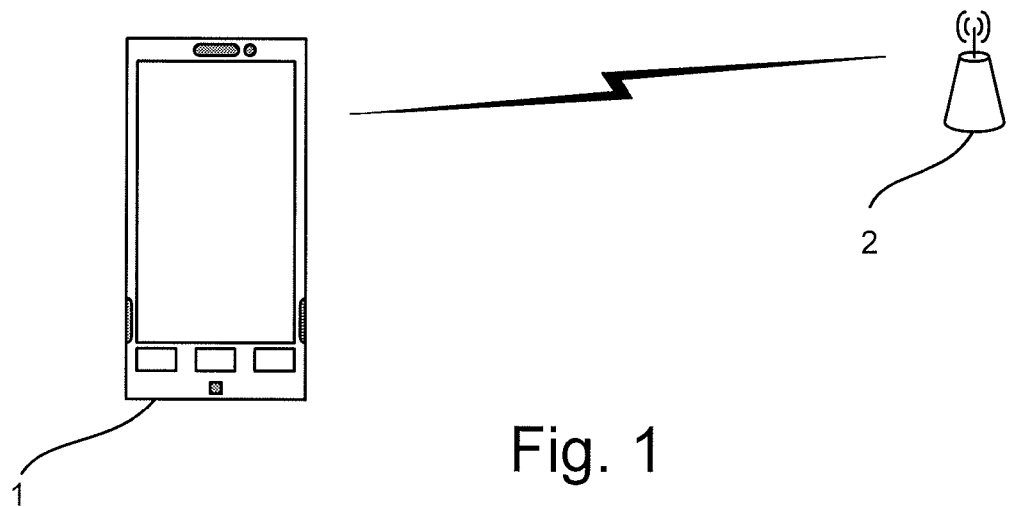
FIG. 1 schematically illustrates a mobile terminal in communication with a radio base station.

FIG. 1 illustrates schematically an environment where embodiments of the present invention may be employed. A mobile terminal (MT) 1, in FIG. 1 depicted as a mobile phone, communicates wirelessly via radio signals with a radio base station (BS) 2, e.g. in a cellular communication network. The MT 1 and the BS 2 are non-limiting examples of what is generically referred to below as an "electronic apparatus".

Figure 2:
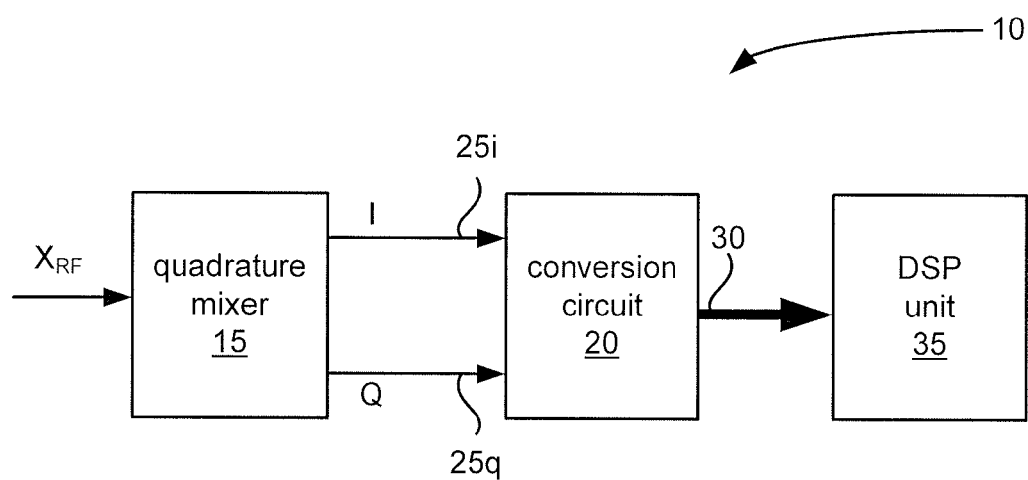
FIG. 2 is a block diagram of a radio receiver circuit according to an embodiment of the present invention.

FIG. 2 is a block diagram of a radio-receiver circuit 10 according to an embodiment of the present invention. The radio-receiver circuit 10 may be comprised in an electronic apparatus, such as the MT 1 or BS 2 mentioned above.

According to the embodiment, the radio-receiver circuit 10 comprises a quadrature mixer 15 and a conversion circuit 20. The quadrature mixer 15 is arranged to generate a complex analog input signal to the conversion circuit 20 by frequency down-conversion of an RF signal $X_{RF}$ to a frequency band covering 0 Hz. As a nonlimiting example, said frequency band may be centered around 0 Hz. Said complex analog input signal has an in-phase (I) component and a quadrature-phase (Q) component. Quadrature mixers are known in the art and implementational details of the quadrature mixer 15 are therefore not further discussed herein.

The I component is supplied to an input port 25i of the conversion circuit 20, and the Q component is supplied to an input port 25q of the conversion circuit 20. The conversion circuit 20 is adapted to convert the complex analog input signal of the conversion circuit 20 into a digital representation, as illustrated below in the context of various embodiments. The digital representation is output on an output port 30 of the conversion circuit 20. As described below, said digital representation may comprise a plurality of components, wherein each component is a digital representation of the complex analog input signal of the conversion circuit 20 in a particular frequency band.

As illustrated in FIG. 2, the radio-receiver circuit 10 may further comprise a digital signal processing (DSP) unit 35. The DSP unit 35 may e.g. be a digital baseband processor or the like. The DSP unit 35 may be adapted for further processing (e.g. demodulation and decoding of data, etc.) of the digital representation output on the output port 30 of the conversion circuit 20.

Figure 3:
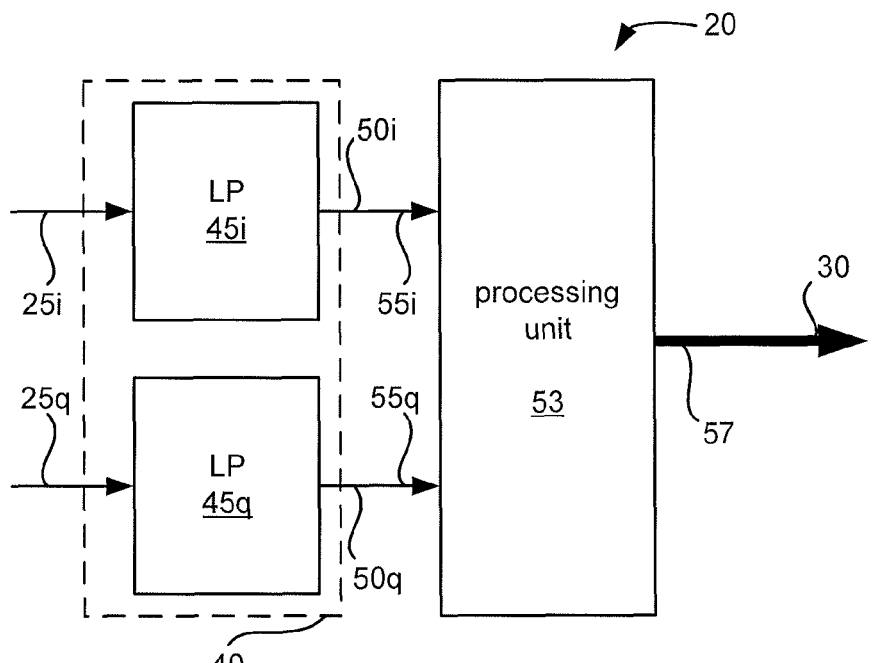
FIG. 3 is a block diagram of a conversion circuit according to an embodiment of the present invention.

FIG. 3 is a block diagram of an embodiment of the conversion circuit 20. According to the embodiment, the conversion circuit 20 comprises a channel-selection filter (CSF) unit 40. The CSF unit 40 is arranged to filter the complex analog input signal, thereby generating a channel-filtered I component on an output port 50i of the CSF unit 40, and a channel-filtered Q component on an output port 50q of the CSF unit 40. The CSF unit 40 has a passband that covers 0 Hz. For example, as illustrated in FIG. 3, the CSF unit 40 may comprise a low-pass (LP) filter 45i arranged to filter the I component of the complex analog input signal, thereby generating the channel-filtered I component, and an LP filter 45q arranged to filter the Q component of the complex analog input signal, thereby generating the channel-filtered Q component. Preferably, the LP filters 45i and 45q have the same frequency response. For this case, the passband of the CSF unit 40 is centered around 0 Hz. Alternatively, the CSF unit 40 may be implemented as a complex bandpass filter, which has a center frequency other than 0 Hz. The design of such filters is e.g. disclosed in the article P. Andreani et al, "A CMOS gm-C Polyphase Filter with High Image Band Rejection", *Proceedings of 26th European Solid-State Circuits Conference (ESSCIRC '00)*, pp. 244-247, September 2000.

Furthermore, according to the embodiment illustrated in FIG. 3, the conversion circuit 20 comprises a processing unit 53. The processing unit 53 has an input port 55i operatively connected to the output port 50i of the CSF unit 40 for receiving the channel-filtered I component. Furthermore, the processing unit 53 has an input port 55q operatively connected to the output port 50q of the CSF unit 40 for receiving the channel-filtered Q component. Moreover, the processing unit 53 has an output port 57 for outputting the digital representation of the complex analog input signal of the conversion circuit. The output port 57 of the processing unit 53 is operatively connected to the output port 30 of the conversion circuit 20.

Figure 4:
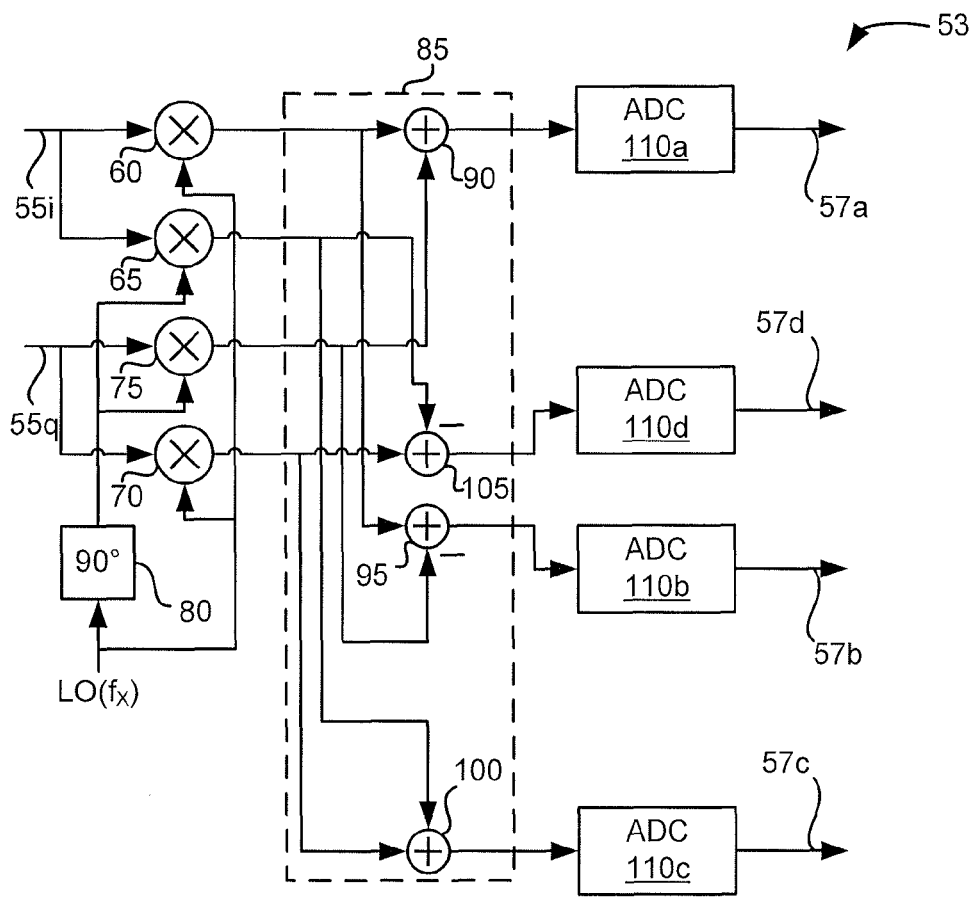
FIGS. 4-5 are block diagrams of a processing unit according to embodiments of the present invention.
Figure 5:
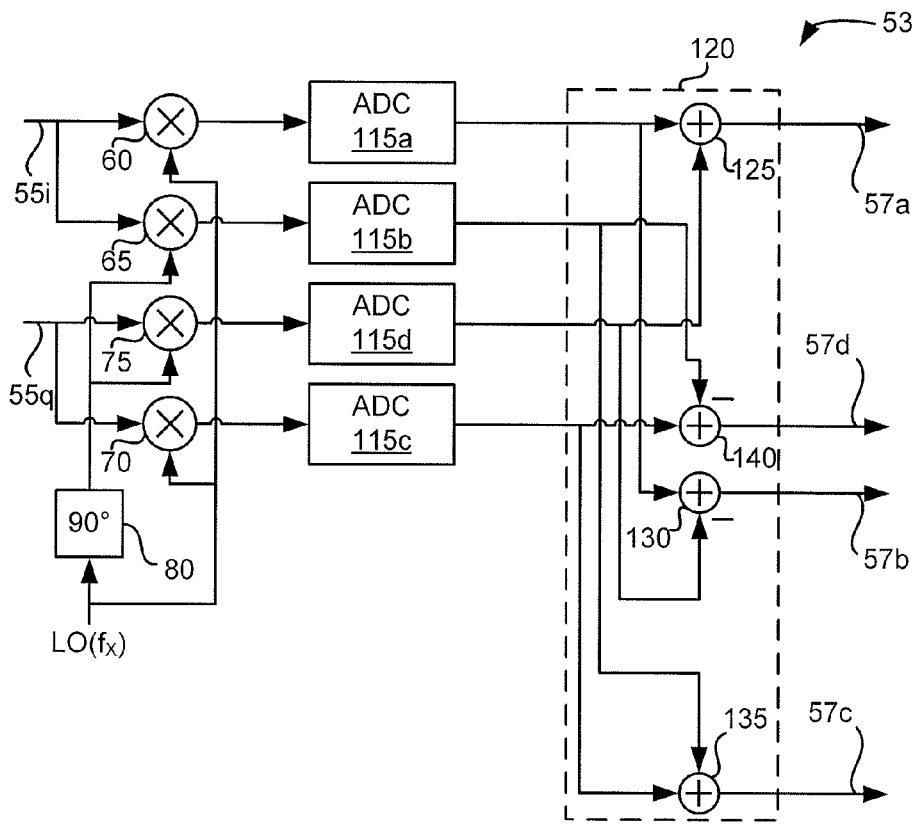

FIGS. 4 and 5 are block diagrams of two alternative embodiments of the processing unit 53. Below, a general description of the processing unit 53 is given with reference to both FIG. 4 and FIG. 5. Thereafter, specific details are described for FIG. 4 and FIG. 5 separately.

According to the embodiments illustrated in FIGS. 4 and 5, the processing unit comprises a first mixer 60 arranged to mix the channel-filtered I component with a first local-oscillator (LO) signal for generating a first frequency-translated I component. Furthermore, the processing unit 53 comprises a second mixer 65 arranged to mix the channel-filtered I component with a second LO signal for generating a second frequency-translated I component. Moreover, the processing unit 53 comprises a third mixer 70 arranged to mix the channel-filtered Q component with the first LO signal for generating a first frequency-translated Q component. In addition thereto, the processing unit 53 comprises a fourth mixer 75 arranged to mix the channel-filtered Q component with the second LO signal for generating a second frequency-translated Q component. As illustrated in FIGS. 4 and 5, the first and the second LO signal of the processing unit 53 have a common LO frequency $f_x$ and a mutual 90° phase shift.

Furthermore, according to the embodiments illustrated in FIGS. 4 and 5, the processing unit 53 comprises a combiner unit (85 in FIG. 4, 120 in FIG. 5). The combiner unit 85, 120 is arranged to generate a first combined signal proportional to a sum of the first frequency translated I component and the second frequency-translated Q component, as illustrated with the adders 90 (FIG. 4) and 125 (FIG. 5). Furthermore, the combiner unit 85, 120 is arranged to generate a second combined signal proportional to a difference between the first frequency translated I component and the second frequency-translated Q component, as illustrated with the subtractors 95 (FIG. 4) and 130 (FIG. 5). Moreover, the combiner unit 85, 120 is arranged to generate a third combined signal proportional to a sum of the second frequency-translated I component and the first frequency-translated Q-component, as illustrated with the adders 100 (FIG. 4) and 135 (FIG. 5). In addition, the combiner unit 85, 120 is arranged to generate a fourth combined signal proportional to a difference between the first frequency-translated Q component and the second frequency-translated I component as illustrated with the subtractors 105 (FIG. 4) and 140 (FIG. 5). The first and the fourth combined signals form a first complex signal. Furthermore, and the second and the third combined signals form a second complex signal.

Moreover, the processing unit 85, 120 comprises a first analog-to-digital converter (ADC) (110a in FIG. 4, 115a FIG. 5), a second ADC (110b in FIG. 4, 115b FIG. 5), a third ADC (110c in FIG. 4, 115c FIG. 5), and a fourth ADC (110d in FIG. 4, 115d FIG. 5) for providing the first combined signal, the second combined signal, the third combined signal, and the fourth combined signal in the digital domain for forming the digital representation of the analog complex input signal. The digital-domain versions of the first, second, third, and fourth combined signals are output on output ports 57a, 57b, 57c, and 57d, respectively. Each of the output ports 57a-d forms part of the output port 57 (FIG. 3).

In the embodiment illustrated in FIG. 4, the combiner unit 85 is an analog combiner unit adapted to generate the first combined signal, the second combined signal, the third combined signal, and the fourth combined signal in the analog domain. The first ADC 110a is arranged to convert the first combined signal to the digital domain. Furthermore, the second ADC 110b is arranged to convert the second combined signal to the digital domain. Moreover, the third ADC 110c is arranged to convert the third combined signal to the digital domain. In addition thereto, the fourth ADC 110d is arranged to convert the fourth combined signal to the digital domain.

In the alternative embodiment illustrated in FIG. 5, the combiner unit 120 is instead a digital combiner unit adapted to generate the first combined signal, the second combined signal, the third combined signal, and the fourth combined signal in the digital domain based on digital versions of the first frequency-translated I component, the second frequency-translated I component, the first frequency-translated Q component, and the second frequency-translated Q component. The first ADC 115a is operatively connected to the first mixer 60 and arranged to convert the first frequency-translated I component to said digital version of the first frequency-translated I component. Furthermore, the second ADC 115b is operatively connected to the second mixer 65 and arranged to convert the second frequency-translated I component to said digital version of the second frequency-translated I component. Moreover, the third ADC 115c is operatively connected to the third mixer 70 and arranged to convert the first frequency-translated Q component to said digital version of the first frequency-translated Q component. In addition thereto, the fourth ADC 115d is operatively connected to the fourth mixer 75 and arranged to convert the second frequency-translated Q component to said digital version of the second frequency-translated Q component.

In the embodiments illustrated in FIGS. 4 and 5, the mixers 60, 65, 70, 75 are illustrated as directly generating the first and second frequency translated I and Q components. However, in other embodiments, further analog signal processing, such as buffering and/or filtering may be involved after the mixers 60, 65, 70, 75 in the generation of the first and second frequency translated I and Q components.

Figure 6:
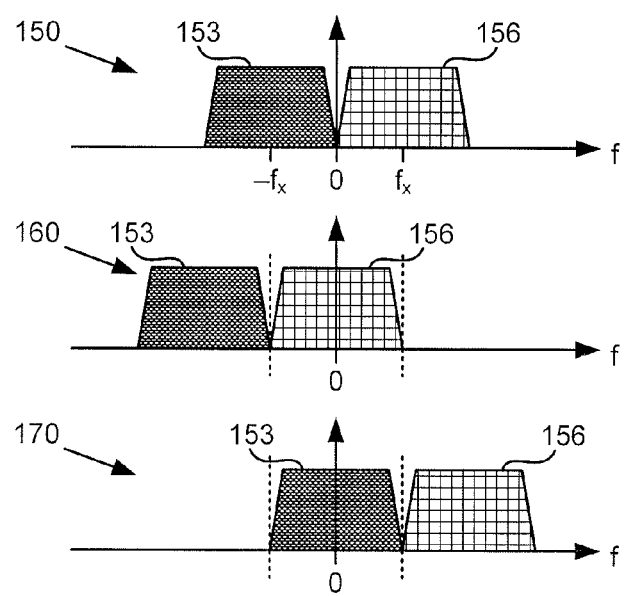
FIG. 6 schematically illustrates frequency bands according to an example.

FIG. 6 schematically illustrates signal spectra according to an example, which is utilized to elucidate advantages of the above-described embodiments. In the plot 150, a signal spectrum of an example of the complex analog input signal to the conversion circuit is illustrated. It has a two contiguous frequency bands; a first frequency band centered around $-f_x$ and a second frequency band centered around $f_x$. Each of the frequency bands carry an associated information signal 153, 156.

In the plot 160, a corresponding signal spectrum of one of the first and second complex signals is illustrated. Similarly, in the plot 170, a corresponding signal spectrum of the other one of the first and the second complex signal is illustrated. In the plot 160, it can be seen that a frequency translation has taken place such that the frequency band initially (i.e. in the plot 150) centered around $f_x$ has been translated to a frequency band centered around 0 Hz. This frequency band is in the following referred to as "the frequency band of interest" and is marked with dotted lines. Similarly, in the plot 170, it can be seen that a frequency translation has taken place such that the frequency band initially (i.e. in the plot 150) centered around $-f_x$ has been translated to said frequency band of interest. An advantage of the embodiments described above is that a complete digital representation of the complex analog input signal by means of ADCs (e.g. ADCs 110*a-d* or 115*a-d*) having bandwidths corresponding to said frequency band of interest. Notably, this bandwidth is smaller than the total bandwidth of the complex analog input signals (in this example, half the size of the bandwidth of the complex analog input signal). In other words, each of the ADCs 110*a-d* or 115*a-d* may have a bandwidth that is lower than that of the CSF unit 40. At least for relatively high bandwidths, the power consumption of an ADC normally does not increase linearly with increasing bandwidth, but instead typically increases faster than linearly. For example, doubling the signal transfer bandwidth of a $\Delta\Sigma$ ADC may require more than a doubling of the power consumption. Hence, using four ADCs with half the bandwidth of the complex analog input signal rather than two ADCs having the full bandwidth of the complex analog input signal (which would be required for performing a direct analog-to-digital conversion of the complex analog input signal) facilitates an overall reduction of power consumption.

In the plots 160 and 170, the spectra of the information signals 153 and 156, respectively, which appear outside of the frequency bands of interest, are also included undistorted. However, these are not needed in an undistorted form in the digital representations of the first and second complex signals in order to form a complete digital representation of the complex analog input signal. Hence, these signals can be removed, or at least suppressed, by filtering already in the analog domain. For example, if the ADCs 110*a-d* or 115*a-d* are Nyquist-rate ADCs, such filtering may be performed by anti-aliasing filters of the ADCs 110*a-d* or 115*a-d*. Alternatively, as mentioned above, filtering may be involved in the generation of the first and second frequency translated I and Q components. Additionally or alternatively, if the ADCs 110*a-d* or 115*a-d* are noise-shaping ADCs, such as $\Delta\Sigma$ ADCs, the signals appearing outside said frequency band of interest may be "drown" (fully or partly) in the resulting shaped noise-floor in the digital representations of the first and the second complex signals. For simplicity, neither any noise nor any suppression by filtering of the information signal outside the frequency band of interest is included in the plots in FIG. 6. The shaped noise and any information signals (e.g. 153 or 156) appearing outside the frequency band of interest may be removed (or suppressed), e.g. within the ADCs 115*a-d* and/or in the digital domain by means of dedicated filtering and/or as a part of a decimation or interpolation process.

Figure 7:
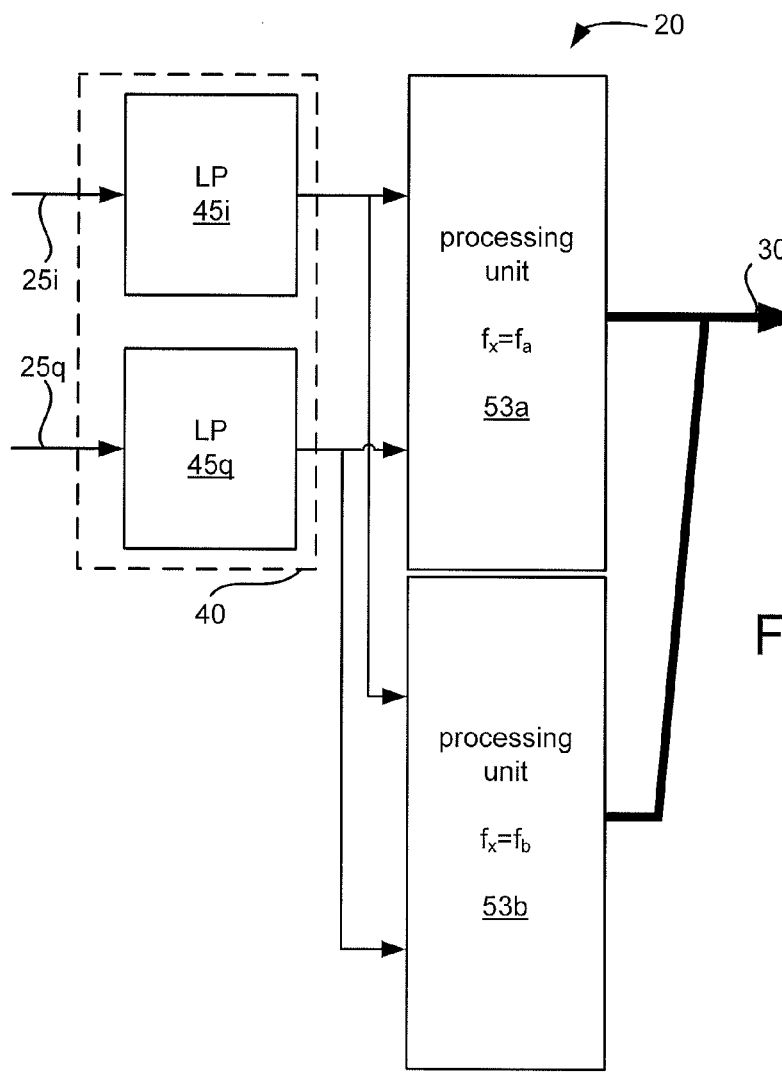
FIG. 7 is a block diagram of a conversion circuit according to an embodiment of the present invention.

FIG. 7 is a block diagram of another embodiment of the conversion circuit 20. In this embodiment, the conversion circuit 20 comprises two processing units 53*a* and 53*b*. According to the embodiment, these processing units operate at mutually different associated LO frequencies; the processing unit 53*a* operates at the LO frequency $f_x=f_a$, and the processing unit 53*b* operates at the frequency $f_x=f_b$. This concept can be extended to any number of processing units operating at mutually different associated LO frequencies.

Figure 8:
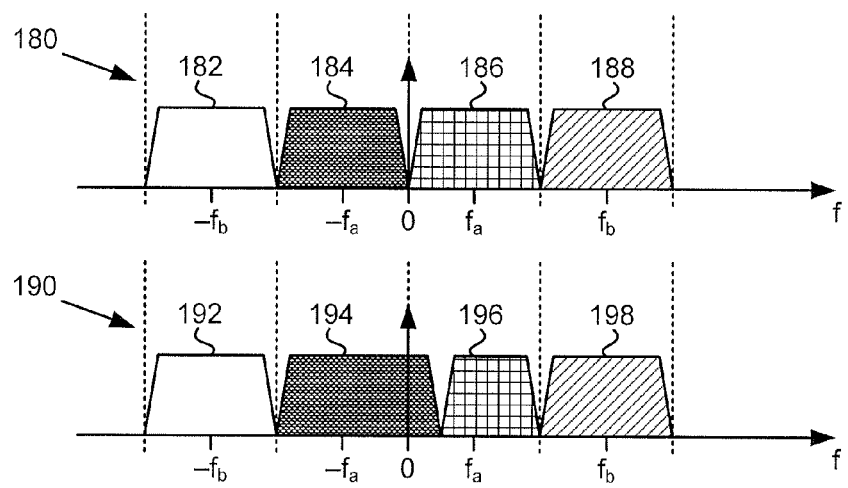
FIG. 8 schematically illustrates frequency bands according to an example.

FIG. 8 schematically illustrates signal spectra according to examples, which are utilized to further elucidate the embodiment illustrated in FIG. 7. In the plot 180, a signal spectrum of an example of the complex analog input signal to the conversion circuit 20 is illustrated. It has four contiguous frequency bands: a first frequency band centered around $-f_b$, a second frequency band centered around $-f_a$, a third frequency band centered around $f_a$, and a fourth frequency band centered around $f_b$. Each of the frequency bands carry an associated information signal 182, 184, 186, 188. The first and the fourth frequency bands (centered around $-f_b$ and $f_b$) are processed by the processing unit 53*b*, and are represented in (said frequency band of interest of) the digital representations of the first and second complex signals of the processing unit 53*b*. Similarly, the second and the third frequency bands (centered around $-f_a$ and $f_a$) are processed by the processing unit 53*a*, and are represented in (said frequency band of interest of) the digital representations of the first and second complex signals of the processing unit 53*a*. The frequency bands that are frequency translated to the frequency band of interest of different ones of the first and second complex signals of the processing units 53*a* and 53*b* are separated by dotted lines in FIG. 8.

In the embodiments illustrated in FIG. 6 and plot 180 of FIG. 8, the conversion circuit 20 is configured such that each of said information signals 153, 156, 182, 184, 186, 188 is represented, in its entirety, in the digital representation of one of the first complex signal and the second complex signal of one of the processing units 53, 53*a*, 53*b*.

However, in other embodiments, the conversion circuit 20 may be configured such that at least one of said information signals is represented partly in a primary signal of the digital representations of first complex signal and the second complex signal of one of the processing units 53, 53*a*, 53*b*, and partly in a secondary signal of the digital representations of the first complex signal and the second complex signal of one of the processing units 53, 53*a*, 53*b*. This is illustrated in FIG. 8, where the information signal 194 covers such a large frequency band that it will be represented partly in the digital representation of the first complex signal and partly in the digital representation of the second complex signal of the processing unit 53*a*. The radio-receiver circuit 10 may therefore comprise recombining circuitry adapted to recombine said at least one of the information signals from said primary signal and said secondary signal. For example, the DSP unit 35 (FIG. 2) may be adapted or programmed to perform this recombining. In embodiments where the radio-receiver circuit 10 is an orthogonal frequency-division multiplexing (OFDM) receiver circuit, such recombining may be performed at relatively low complexity in the frequency domain (i.e. after performing an FFT). Hence, in these embodiments, said recombining circuitry may be adapted to recombine said at least one of the information signals in the frequency domain.

In the embodiment illustrated in FIG. 7, the number of ADCs (8) is further increased compared with the number of ADCs (4) in the embodiments illustrated in FIGS. 3-5. At the same time, however, the total bandwidth requirement of each individual ADC is halved. Again, since the power consumption normally does not increase linearly with increasing bandwidth, but instead typically increases faster than linearly, the embodiment illustrated in FIG. 7 facilitates an even further overall reduced power consumption.

In order to obtain a relatively high signal quality in the output of the conversion circuit 20, the first mixer 60, second mixer 65, third mixer 70, and the fourth mixer 75 may be implemented as so called harmonic rejection mixers. In such a mixer, (unwanted) signal components that are frequency translated to the frequency band of interest by harmonics of the LO signal are suppressed or rejected. This can e.g. be achieved by driving the mixer with a sinusoidal or close to sinusoidal LO signal. The required degree of harmonic suppression (corresponding to the degree of resemblance with a completely sinusoidal LO signal) may be different from application to application and can e.g. be determined based on system specifications. There is also a trade-off between the degree of harmonic rejection and the complexity (e.g. in terms of filter order) of the CSF unit 40. This is further elucidated below with reference to FIG. 10.

The inventors have realized that the hardware cost of embodiments of the present invention can be kept relatively low by implementing each of the first mixer 60, the second mixer 65, the third mixer 70, and the fourth mixer 75 with a switchable resistor network operatively connected to an input circuit of an ADC 110a-d, 115a-d, wherein a resistance of the switchable resistor network is switchably variable in response to either the first LO signal (for the first and the third mixer 60, 70) or the second LO signal (for the second and the fourth mixer (65, 75)). This is illustrated with embodiments in FIGS. 9-13.

Figure 9:
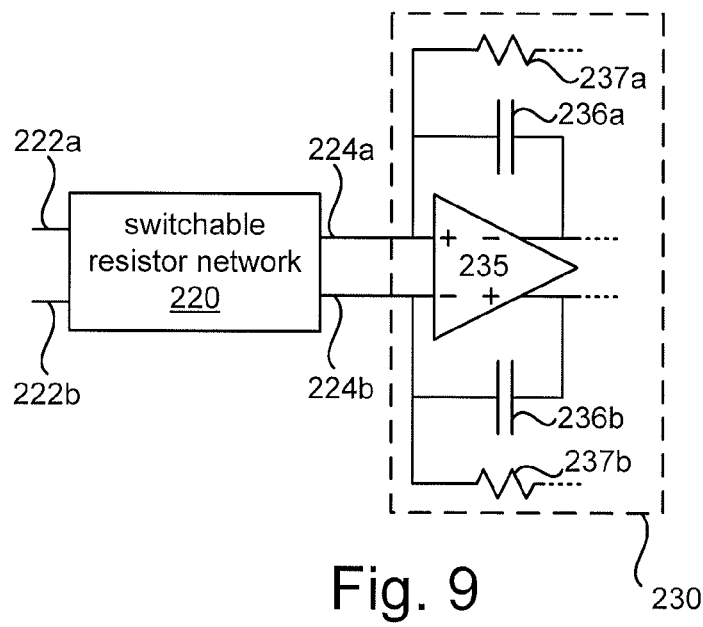
FIG. 9 illustrates a switchable resistor network operatively connected to an input circuit of an ADC according to an embodiment of the present invention.

FIG. 9 illustrates a switchable resistor network 220 having a differential input port comprising input terminals 222a and 222b, and output terminals 224a and 224b. The input port of the switchable resistor network is adapted to receive one of the channel filtered I and Q components (which are each assumed to be differential signals in this embodiment). The output terminal 224a is connected to a positive input terminal of an operational amplifier (OP) 235 in an input circuit 230 of an ADC. The ADC may e.g. be a noise-shaping ADC, such as a ΔΣ ADC. Similarly, the output terminal 224b is connected to a negative input terminal of the OP 235. In particular embodiment illustrated in FIG. 9, the input circuit 230 comprises feedback capacitors 236a and 236b. Thereby, the switchable resistor network 220 together with said input circuit 230 forms an active RC integrator. Such an RC integrator provides low-impedance nodes ("virtual ground" nodes at the inputs of the OP 235), which are suitable for providing current combining (which is e.g. utilized in the embodiment illustrated in FIG. 14). The input circuit 230 may comprise feedback resistors 237a and 237b providing integration of signals fed back from later stages of the ADC (which is typically the case in a ΔΣ ADC) as well as the signal input to the switchable resistor network 220. By varying said resistance (as will be further illustrated below) of the switchable resistor network, the overall gain from the input port of the switchable resistor network 220 to the output of the OP 235 is varied. In particular, by varying said resistance in accordance with the LO signal, said gain is also varied in accordance with the LO signal. Thereby, an effective multiplication with the LO signal (i.e. mixing) is achieved. Another way of viewing this effect is that the switchable resistor network performs a voltage (v) to current (i) (v/i) conversion of the voltage applied to the input port of the switchable resistor network, and that the v/i conversion factor depends on said resistance of the switchable resistor network 220.

Figure 10:
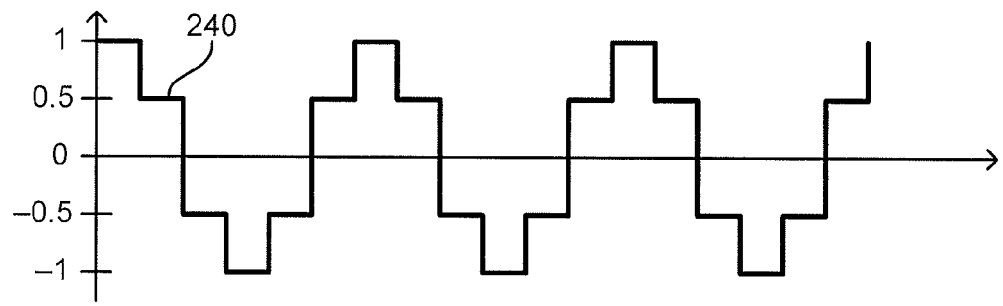
FIG. 10 illustrates a local-oscillator signal according to an example.

FIG. 10 illustrates an LO signal that will be considered in the embodiments described below, shown with a time-domain waveform 240. This LO signal is a piecewise constant signal corresponding to a discrete-time sinusoidal signal that is updated with an update rate that is six times higher than the LO frequency. An advantage of this particular LO signal is that it has levels (−1, −0.5, 0.5, and 1) which are integer multiples of a basic level (0.5), which allows for a relatively simple implementation of the switchable resistor network. However, if a higher degree of harmonic rejection is required, another (higher) update rate than six times the LO frequency may need to be used. In that case, the LO signal will have other levels that might not all be integer multiples of a basic level. With the specific setup of 6 samples per LO period as exemplified above and in FIG. 10, the first sampling image (or nonzero harmonic of the LO signal) will appear at $5f_{LO}$ (where $f_{LO}$ is the LO frequency). Since the LO signal has a piecewise constant shape, this spurious tone at $5f_{LO}$ is attenuated (compared with the fundamental tone) by a sinc function, as is readily understood by a skilled person in the field of discrete-time signal processing. At $5f_{LO}$, this attenuation is about 14 dB. If, as an example, the conversion gain needs to be 60 dB lower at $5f_{LO}$ than at $f_{LO}$, some additional 46 dB suppression at $5f_{LO}$ is required by the CSF unit 40. This can be achieved by a Chebychev filter of order 5-6 and a few tenths of dB in ripple. If a simpler filter (e.g. of lower order) is desired, a higher update rate of the LO should be used.

Figure 11:
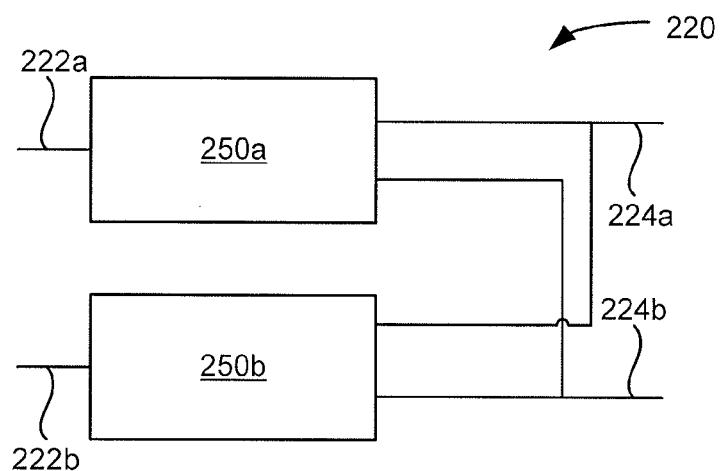
FIG. 11 is a block diagram of a switchable resistor network according to an embodiment of the present invention.

FIG. 11 illustrates an embodiment of the switchable resistor network 220 which is implemented by means of two sub networks 250a (connected to the input terminal 222a and both output terminals 224a and 224b) and 250b (connected to the input terminal 222b and both output terminals 224a and 224b). Various embodiments of the sub networks 250a and 250b are discussed below with reference to FIGS. 12 and 13.

Figure 12:
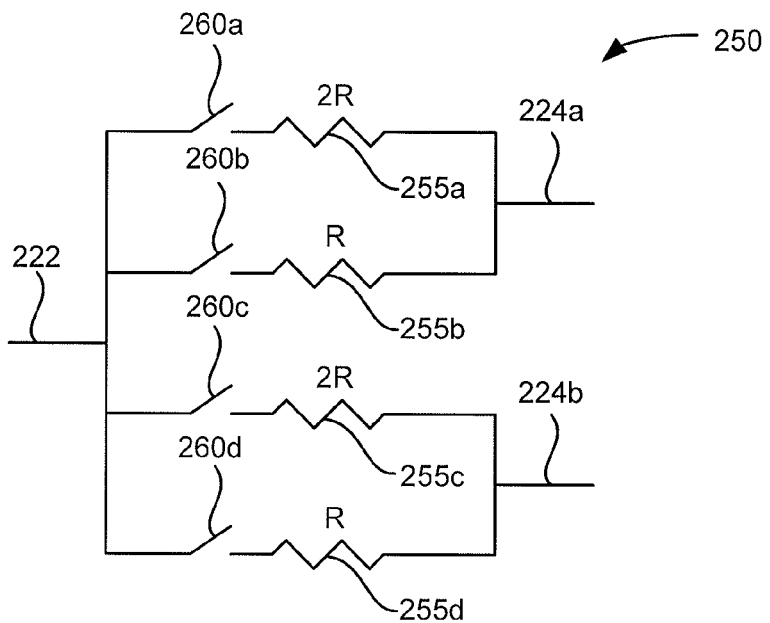
FIGS. 12-13 are circuit diagrams of part of a switchable resistor network according to embodiments of the present invention.

In the embodiment illustrated in FIG. 12, the sub network 250 (which may be either of the sub networks 250a and 250b in FIG. 11) comprises a resistor 255a with resistance 2R connected between the input terminal 222 (which is either 222a or 222b in FIG. 11, depending on which of the sub networks 250a and 250b that is considered) and the output terminal 224a via a switch 260a. Furthermore, the sub network 250 comprises a resistor 255b with resistance R connected between the input terminal 222 and the output terminal 224a via a switch 260b. Moreover, the sub network 250 comprises a resistor 255c with resistance 2R connected between the input terminal 222 and the output terminal 224b via a switch 260c. In addition, the sub network 250 comprises a resistor 255d with resistance R connected between the input terminal 222 and the output terminal 224b via a switch 260d.

In operation, one and only one of the switches 260a-d is closed at a time. When the LO signal adopts the level 1, the switch 260b is closed. Thereby, a resistance R is provided between the input terminal 222 and the output terminal 224a, and an infinite resistance is provided between the input terminal 222 and the output terminal 224b. When the LO signal adopts the level 0.5, the switch 260a is closed. Thereby, a resistance 2R is provided between the input terminal 222 and the output terminal 224a, and an infinite resistance is provided between the input terminal 222 and the output terminal 224b. When the LO signal adopts the level −0.5, the switch 260c is closed. Thereby, a resistance 2R is provided between the input terminal 222 and the output terminal 224b, and an infinite resistance is provided between the input terminal 222 and the output terminal 224a. When the LO signal adopts the level −1, the switch 260d is closed. Thereby, a resistance R is provided between the input terminal 222 and the output terminal 224b, and an infinite resistance is provided between the input terminal 222 and the output terminal 224a.

With the embodiment illustrated in FIG. 12, an overall input resistance of the combination of the switchable resistor network 220 and the input circuit 230 of the ADC varies with the LO signal. This may deteriorate the signal quality to some extent. In accordance with some embodiments, the switchable resistor network 220 is therefore arranged to provide a constant input resistance to the combination of the switchable resistor network 220 and said input circuit 230. An example of such an embodiment is illustrated in FIG. 13 with an embodiment of a sub network 250, which may again be either of the sub networks 250a and 250b in FIG. 11.

Figure 13:
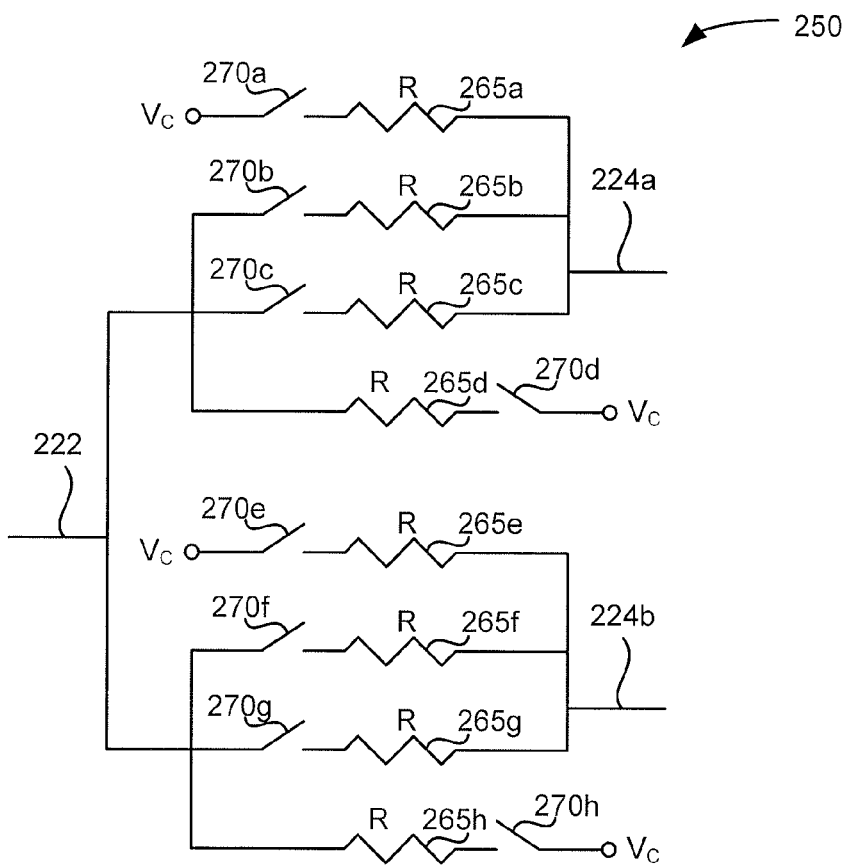

The embodiment of the sub network 250 illustrated in FIG. 13 comprises a resistor 265a with resistance R connected between a reference voltage node with a common-mode reference voltage $V_C$ and the output terminal 224a via a switch 270a. Furthermore, the sub network 250 comprises resistors 265b and 265c, each having a resistance R, connected between the input terminal 222 and the output terminal 224a via switches 270b and 270c, respectively. Moreover, the sub network 250 comprises a resistor 265d with resistance R connected between a reference voltage node with the common-mode reference voltage $V_C$ and the input terminal 222 via a switch 270d.

In addition thereto, the embodiment of the sub network 250 illustrated in FIG. 13 comprises a resistor 265e with resistance R connected between a reference voltage node with the common-mode reference voltage $V_C$ and the output terminal 224b via a switch 270e. Furthermore, the sub network 250 comprises resistors 265f and 265g, each having a resistance R, connected between the input terminal 222 and the output terminal 224b via switches 270f and 270g, respectively. Moreover, the sub network 250 comprises a resistor 265h with resistance R connected between a reference voltage node with the common-mode reference voltage $V_C$ and the input terminal 222 via a switch 270h.

The following switching scheme can be used in order to obtain the desired constant input resistance:

When the LO signal adopts the value 1, the two switches 270b and 270c are closed, whereas the other switches are open. When the LO signal adopts the value 0.5, the three switches 270b (or, alternatively, 270c), 270a, and 270d are closed, whereas the other switches are open. When the LO signal adopts the value −0.5, the three switches 270f (or, alternatively, 270g), 270e, and 270h are closed, whereas the other switches are open. When the LO signal adopts the value −1, the two switches 270f and 270g are closed, whereas the other switches are open.

Figure 14:
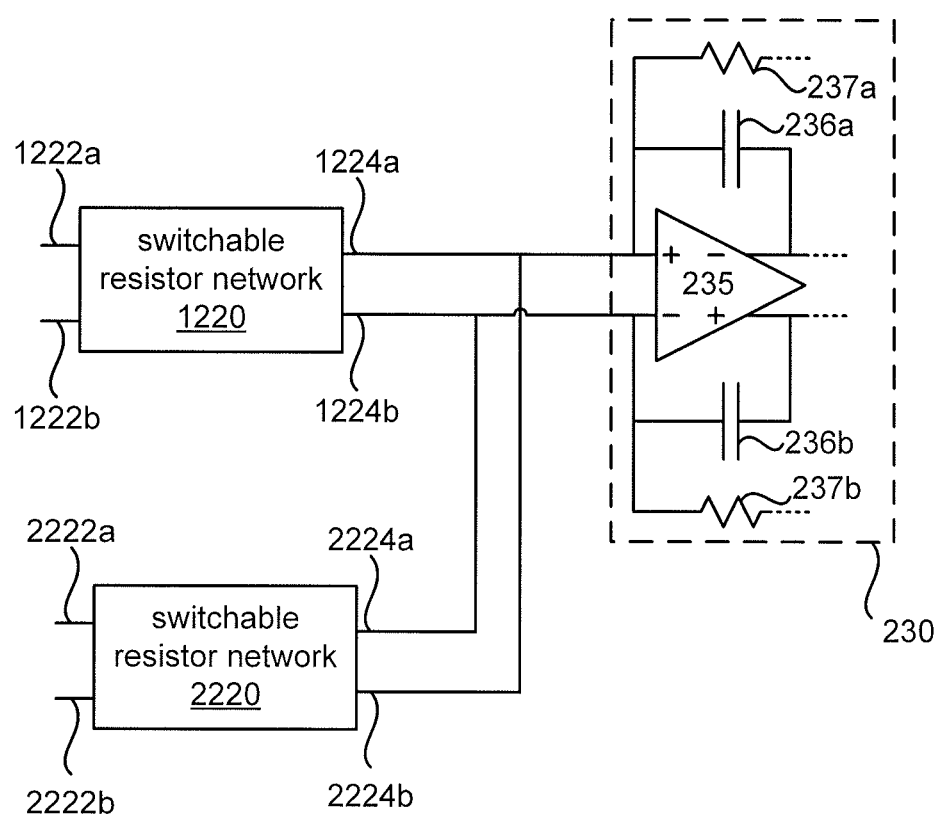
FIG. 14 illustrates switchable resistor networks operatively connected to an input circuit of an ADC according to an embodiment of the present invention.

The embodiments of the switchable resistor network 220 described above with reference to FIGS. 9-13 are suitable for implementation of the mixers 60, 65, 70, and 75 in the embodiment of the processing unit 53 illustrated in FIG. 5, where each of the mixers 60, 65, 70, and 75 are operatively connected to a single one of the ADCs 115a-d. However, a similar implementation is suitable also for the embodiment of the processing unit 53 illustrated in FIG. 4, wherein each of the mixers 60, 65, 70, and 75 is operatively connected to a first one and a second one of the ADCs 110a-d via the intermediate combiner unit 85. For these embodiments, each mixer 60, 65, 70, and 75 may be implemented with a switchable resistor network which comprises two switchable resistor networks 220 of the type described above with reference to FIGS. 9-13; one of which is connected to an input circuit of said first one of the of the ADCs 110a-d, while the other one is connected to an input circuit of said second one of the ADCs 110a-d. Since the switchable resistor networks perform v/i conversion, and the outputs thereof therefore are currents, the summations and subtractions of the combiner unit 85 can be implemented as current summations by appropriate interconnections of the switchable resistor networks used for implementation of the mixers 60, 65, 70, and 75. The appropriate sign (plus or minus) of the contribution from a particular mixer 60, 65, 70, and 75 to an input of a particular ADC 110a-d can be obtained by selecting which one of the output terminals 224a and 224b (FIG. 9) is connected to which one of the positive and negative input terminals of the OP 235. Changing which one of the output terminals 224a and 224b (FIG. 9) is connected to which one of the positive and negative input terminals of the OP 235 changes the polarity. This is illustrated in FIG. 14. FIG. 14 includes two switchable resistor networks 1220 and 2220. Each of the switchable resistor networks 1220 and 2220 may be implemented in the same way as the switchable resistor network 220 described above in the context of various embodiments. The terminals 1222a, 1222b, 1224a, and 1224b of the switchable resistor network 1220 correspond to the terminals 222a, 222b, 224a, and 224b, respectively, of the switchable resistor network 220. Similarly, the terminals 2222a, 2222b, 2224a, and 2224b of the switchable resistor network 2220 correspond to the terminals 222a, 222b, 224a, and 224b, respectively, of the switchable resistor network 220. As an elucidating example, the ADC input circuit 230 in FIG. 14 may e.g. be an input circuit of the ADC 110d (FIG. 4). The switchable resistor network 1220 may in that example form part of the mixer 70 (FIG. 4), and the switchable resistor network 2220 may form part of the mixer 65 (FIG. 4). The function of the subtractor 105 is realized by the different polarities of the switchable resistor networks 1220 and 2220. The switchable resistor network 1220 has the output terminal 1224a connected to the positive input terminal of the OP 235 and the output terminal 1224b connected to the negative input terminal of the OP 235, and thus gives a positive (or "additive") contribution to the input signal of the input circuit 230. On the other hand, the switchable resistor network 2220 has the output terminal 2224b connected to the positive input terminal of the OP 235 and the output terminal 1224a connected to the negative input terminal of the OP 235, and thus gives a negative (or "subtractive") contribution to the input signal of the input circuit 230. Thereby, the desired functionality of the subtractor 105 is obtained through the interconnections between the switchable resistor networks 1220 and 2220 and the input circuit 230. The desired functionality of the other subtractor 95 can of course be obtained in the same way. If instead the output terminal 2224a had been connected to the positive input terminal of the OP 235 and the output terminal 2234b had been connected to the negative input terminal of the OP 235, also the switchable resistor network 2220 would have provided a positive contribution to the input signal of the input circuit 230. Such an interconnect is suitable to implement the functionality of the adders 90 and 100 (FIG. 4). An equivalent way of obtaining the change of polarity is to alter the switching sequence of the switches 260a-d (FIG. 12) or 270a-h (FIG. 13).

As described above, it is an advantage of embodiments of the present invention that a relatively low power consumption is facilitated. Another advantage of embodiments of the present invention is the potential of design reuse as bandwidth requirements increase; instead of having to design a new ADC with higher bandwidth to meet the increasing bandwidth requirements, it may be possible to reuse a previous ADC design that does not in itself meet the new bandwidth requirements, and instead increase the number of ADCs to meet said new bandwidth requirement.

The present invention has been described above with reference to specific embodiments. However, other embodiments than the above described are possible within the scope of the invention. The different features of the embodiments may be combined in other combinations than those described. The scope of the invention is only limited by the appended patent claims.

The invention claimed is:

1. A conversion circuit for converting a complex analog input signal having an in-phase (I) component and a quadrature-phase (Q) component resulting from frequency down conversion of a radio frequency (RF) signal to a frequency band covering 0 Hz into a digital representation, the conversion circuit comprising:
a channel selection filter configured to filter the complex analog input signal, thereby generating a channel-filtered I component and a channel-filtered Q component, wherein the channel selection filter has a passband that covers 0 Hz; and
one or more processing circuits, each comprising:
a first mixer arranged to mix the channel-filtered I component with a first local-oscillator (LO) signal to generate a first frequency-translated I component;
a second mixer arranged to mix the channel-filtered I component with a second LO signal to generate a second frequency-translated I component;
a third mixer arranged to mix the channel-filtered Q component with the first LO signal to generate a first frequency-translated Q component;
a fourth mixer arranged to mix the channel-filtered Q component with the second LO signal to generate a second frequency-translated Q component; and
a combiner circuit configured to generate:
a first combined signal proportional to a sum of the first frequency translated I component and the second frequency-translated Q component;
a second combined signal proportional to a difference between the first frequency translated I component and the second frequency-translated Q component;
a third combined signal proportional to a sum of the second frequency-translated I component and the first frequency-translated Q-component; and
a fourth combined signal proportional to a difference between the first frequency-translated Q component and the second frequency-translated I component;
wherein the first and the fourth combined signals form a first complex signal;
wherein the second and the third combined signals form a second complex signal; and
a first analog-to-digital converter (ADC), a second ADC, a third ADC, and a fourth ADC configured to provide digital representations of the first complex signal and the second complex signal for forming the digital representation of the analog complex input signal;
wherein the first and the second LO signal of a given processing circuit have a common LO frequency associated with the processing circuit and a mutual 90° phase shift;
wherein each of the first mixer, the second mixer, the third mixer, and the fourth mixer are implemented with a switchable resistor network operatively connected to an input circuit of at least one of the first ADC, the second ADC, the third ADC, and the fourth ADC; and
wherein a resistance of the switchable resistor network is switchably variable in response to either:
the first LO signal for the first and the third mixer; or
the second LO signal for the second and the fourth mixer.

2. The conversion circuit of claim 1, wherein the first mixer, the second mixer, the third mixer, and the fourth mixer are harmonic rejection mixers.

3. The conversion circuit of claim 1:
wherein the combiner circuit is an analog combiner circuit configured to generate the first combined signal, the second combined signal, the third combined signal, and the fourth combined signal in the analog domain;

wherein the first ADC is arranged to convert the first combined signal to the digital domain;
wherein the second ADC is arranged to convert the second combined signal to the digital domain;
wherein the third ADC is arranged to convert the third combined signal to the digital domain; and
wherein the fourth ADC is arranged to convert the fourth combined signal to the digital domain.

4. The conversion circuit of claim 1:
wherein the combiner circuit is a digital combiner circuit configured to generate the first combined signal, the second combined signal, the third combined signal, and the fourth combined signal in the digital domain based on digital versions of the first frequency-translated I component, the second frequency-translated I component, the first frequency-translated Q component, and the second frequency-translated Q component;
wherein the first ADC is operatively connected to the first mixer and is configured to convert the first frequency-translated I component to the digital version of the first frequency-translated I component;
wherein the second ADC is operatively connected to the second mixer and is configured to convert the second frequency-translated I component to the digital version of the second frequency-translated I component;
wherein the third ADC is operatively connected to the third mixer and is configured to convert the first frequency-translated Q component to the digital version of the first frequency-translated Q component; and
wherein the fourth ADC is operatively connected to the fourth mixer and is configured to convert the second frequency-translated Q component to the digital version of the second frequency-translated Q component.

5. The conversion circuit of claim 1, wherein the switchable resistor network is arranged to provide a constant input resistance to the combination of the switchable resistor network and the input circuit.

6. The conversion circuit of claim 1, wherein the switchable resistor network together with the input circuit forms an active RC integrator.

7. The conversion circuit of claim 1, further comprising a plurality of the processing circuits.

8. The conversion circuit of claim 7, wherein the plurality of processing circuits have mutually different associated LO frequencies.

9. The conversion circuit of claim 1, wherein the channel selection filter comprises:
a first low-pass filter configured filter the I component of the complex analog input signal to generate the channel-filtered I component; and
a second low-pass filter configured to filter the Q component of the complex analog input signal to generate the channel-filtered Q component.

10. The conversion circuit of claim 1, wherein each of the first ADC, the second ADC, the third ADC, and the fourth ADC have a bandwidth that is lower than that of the channel selection filter.

11. A radio receiver circuit comprising:
a quadrature mixer for generating a complex analog input signal by frequency down-conversion of a RF signal to a frequency band covering 0 Hz; and
a conversion circuit for converting the complex analog input signal, which has an in-phase (I) component and a quadrature-phase (Q) component resulting from the frequency down conversion, into a digital representation, the conversion circuit comprising:

a channel selection filter configured to filter the complex analog input signal, thereby generating a channel-filtered I component and a channel-filtered Q component, wherein the channel selection filter has a passband that covers 0 Hz; and one or more processing circuits, each comprising:
- a first mixer arranged to mix the channel-filtered I component with a first local-oscillator (LO) signal to generate a first frequency-translated I component;
- a second mixer arranged to mix the channel-filtered I component with a second LO signal to generate a second frequency-translated I component;
- a third mixer arranged to mix the channel-filtered Q component with the first LO signal to generate a first frequency-translated Q component;
- a fourth mixer arranged to mix the channel-filtered Q component with the second LO signal to generate a second frequency-translated Q component; and
- a combiner circuit configured to generate:
  - a first combined signal proportional to a sum of the first frequency translated I component and the second frequency-translated Q component;
  - a second combined signal proportional to a difference between the first frequency translated I component and the second frequency-translated Q component;
  - a third combined signal proportional to a sum of the second frequency-translated I component and the first frequency-translated Q-component; and
  - a fourth combined signal proportional to a difference between the first frequency-translated Q component and the second frequency-translated I component;
- wherein the first and the fourth combined signals form a first complex signal;
- wherein the second and the third combined signals form a second complex signal; and
- a first analog-to-digital converter (ADC), a second ADC, a third ADC, and a fourth ADC configured to provide digital representations of the first complex signal and the second complex signal for forming the digital representation of the analog complex input signal;
- wherein the first and the second LO signal of a processing circuit have a common LO frequency associated with the processing circuit and a mutual 90° phase shift;

wherein each of the first mixer, the second mixer, the third mixer, and the fourth mixer are implemented with a switchable resistor network operatively connected to an input circuit of at least one of the first ADC, the second ADC, the third ADC, and the fourth ADC; and wherein a resistance of the switchable resistor network is switchably variable in response to either:
- the first LO signal for the first and the third mixer; or
- the second LO signal for the second and the fourth mixer.

12. The radio receiver circuit of claim 11:
wherein the RF signal comprises a number of contiguous frequency bands, each carrying an associated information signal; and
wherein the conversion circuit is configured such that each of the information signals is represented, in its entirety, in the digital representation of one of the first complex signal and the second complex signal of one of the processing circuits of the conversion circuit.

13. The radio receiver circuit of claim 11:
wherein the RF signal comprises a number of contiguous frequency bands, each carrying an associated information signal; and
wherein the conversion circuit is configured such that at least one of the information signals is represented partly in a primary signal of the digital representations of the first complex signal and the second complex signal of one of the processing circuits of the conversion circuit, and partly in a secondary signal of the digital representations of the first complex signal and the second complex signal of one of the processing circuits of the conversion circuit.

14. The radio receiver of claim 13, further comprising recombining circuitry configured to recombine at least one of the information signals from the primary signal and the secondary signal.

15. The radio receiver of claim 14:
wherein the radio receiver circuit is an orthogonal frequency-division multiplexing receiver circuit; and
wherein the recombining circuitry is configured to recombine the at least one of the information signals in the frequency domain.

16. The radio receiver of claim 11, wherein the radio receiver is included in a mobile terminal.

17. The radio receiver of claim 11, wherein the radio receiver is included in a radio base station.

18. The radio receiver claim 11, wherein the switchable resistor network is arranged to provide a constant input resistance to the combination of the switchable resistor network and the input circuit.

19. The radio receiver of claim 11, wherein the switchable resistor network together with the input circuit forms an active RC integrator.

* * * * *

UNITED STATES PATENT AND TRADEMARK OFFICE
CERTIFICATE OF CORRECTION

PATENT NO. : 8,867,671 B2  
APPLICATION NO. : 13/702768  
DATED : October 21, 2014  
INVENTOR(S) : Sundström et al.

Page 1 of 1

It is certified that error appears in the above-identified patent and that said Letters Patent is hereby corrected as shown below:

Title page, item (12), under "United States Patent", in Column 1, Line 1, delete "Sunström" and insert -- Sundström --, therefor.

Title page, item (75), "Inventors", in Column 1, Line 1, delete "Lars Sunström," and insert -- Lars Sundström, --, therefor.

Claims

In Column 14, Line 49, in Claim 9, delete "configured" and insert -- configured to --, therefor.

In Column 16, Line 28, in Claim 14, delete "receiver" and insert -- receiver circuit --, therefor.

In Column 16, Line 32, in Claim 15, delete "receiver" and insert -- receiver circuit --, therefor.

In Column 16, Line 38, in Claim 16, delete "receiver" and insert -- receiver circuit --, therefor.

In Column 16, Line 40, in Claim 17, delete "receiver" and insert -- receiver circuit --, therefor.

In Column 16, Line 42, in Claim 18, delete "receiver" and insert -- receiver circuit --, therefor.

In Column 16, Line 46, in Claim 19, delete "receiver" and insert -- receiver circuit --, therefor.

Signed and Sealed this  
Sixteenth Day of February, 2016

Michelle K. Lee  
*Director of the United States Patent and Trademark Office*